United States Patent
Fifield et al.

(10) Patent No.: US 10,446,239 B1
(45) Date of Patent: Oct. 15, 2019

(54) MEMORY ARRAY INCLUDING DISTRIBUTED REFERENCE CELLS FOR CURRENT SENSING

(71) Applicant: GLOBALFOUNDRIES INC., Grand Cayman (KY)

(72) Inventors: John A. Fifield, Underhill, VT (US); Eric Hunt-Schroeder, Essex Junction, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/032,100

(22) Filed: Jul. 11, 2018

(51) Int. Cl.
| | |
|---|---|
| G11C 16/06 | (2006.01) |
| G11C 16/28 | (2006.01) |
| G11C 16/04 | (2006.01) |
| G11C 16/14 | (2006.01) |
| G11C 7/06 | (2006.01) |
| G11C 11/56 | (2006.01) |
| G11C 16/24 | (2006.01) |
| G11C 7/12 | (2006.01) |
| G11C 7/18 | (2006.01) |
| G11C 16/08 | (2006.01) |

(52) U.S. Cl.
CPC .............. G11C 16/28 (2013.01); G11C 7/062 (2013.01); G11C 7/12 (2013.01); G11C 7/18 (2013.01); G11C 11/5642 (2013.01); G11C 16/0483 (2013.01); G11C 16/08 (2013.01); G11C 16/14 (2013.01); G11C 16/24 (2013.01)

(58) Field of Classification Search
CPC ..... G11C 16/28; G11C 16/0483; G11C 16/08; G11C 16/14; G11C 16/24; G11C 7/062; G11C 7/12; G11C 7/18; G11C 11/5642
See application file for complete search history.

(56) References Cited

U.S. PATENT DOCUMENTS

| | | | |
|---|---|---|---|
| 6,215,697 B1 * | 4/2001 | Lu ....................... | G11C 11/5621 365/185.03 |
| 6,600,675 B2 | 7/2003 | Kang et al. | |
| 7,161,861 B2 * | 1/2007 | Gogl ..................... | G11C 5/145 365/205 |
| 7,433,253 B2 * | 10/2008 | Gogl ....................... | G11O 5/02 327/53 |
| 7,529,130 B2 | 5/2009 | Toda | |

(Continued)

Primary Examiner — Pho M Luu
(74) Attorney, Agent, or Firm — Gibb & Riley, LLC; Michael J. LeStrange, Esq.

(57) ABSTRACT

An array of memory cells in rows and columns with each column having a corresponding reference cell and a corresponding comparator. Each memory cell in a given row and given column is connected to a memory wordline for the row and to a memory bitline for the column. Each reference cell is connected to a reference wordline for the reference cells and to a reference bitline. Each comparator for a column has a current mirror with a reference section connected to the reference bitline for the reference cell for the column and a memory section connected to the memory bitline for the memory cells in the column. Each reference section has a current mirror node and all current mirror nodes in the array are connected to reduce mismatch and improve sensing accuracy. Voltages applied to the memory and reference wordlines are varied to provide accurate single-ended sensing, margin testing, etc.

20 Claims, 5 Drawing Sheets

(56) References Cited

U.S. PATENT DOCUMENTS

| | | | |
|---|---|---|---|
| 8,045,380 B2 * | 10/2011 | Byeon | G11C 16/10 365/185.05 |
| 9,025,386 B1 | 5/2015 | Iyer et al. | |
| 9,418,745 B1 | 8/2016 | Chen et al. | |
| 9,589,658 B1 | 3/2017 | Agarwal et al. | |
| 9,659,604 B1 | 5/2017 | Raghavan et al. | |
| 2005/0205969 A1 | 9/2005 | Ono et al. | |
| 2016/0372164 A1 | 12/2016 | Anand et al. | |
| 2017/0169904 A1 | 6/2017 | Erickson et al. | |

* cited by examiner

US 10,446,239 B1

MEMORY ARRAY INCLUDING DISTRIBUTED REFERENCE CELLS FOR CURRENT SENSING

BACKGROUND

Field of the Invention

The present invention relates to charge trap memory arrays and, more particularly, to a memory array with distributed charge trap reference cells that enable single-ended current sensing of charge trap memory cells.

Description of Related Art

A recently developed multiple time programmable memory (MTPM) array includes charge trap memory cells that are arranged in columns and rows. Each memory cell includes a pair of charge trap field effect transistors (CT-FETs) such that the memory cell is referred to as a twin-transistor memory cell. In each column, the CTFETs in each memory cell are connected in series between a pair of bitlines, the bitlines are connected to a sense amplifier, and a source line connects each memory cell in the column to ground at the node between the CTFETs. In each row, the gates of each CTFET in each memory cell are connected to a wordline. Generally, during a read operation for a selected memory cell, a read voltage is applied to the gates of the CTFETs in the selected memory cell through the wordline and the sense amplifier determines the voltage differential between the adjacent bitlines in order to determine whether the selected memory cell stores a "1" bit or a "0" bit. During a write operation for a selected memory cell, a threshold voltage of one of the CTFETs in that memory cell is varied by injecting a charge into its gate or gate oxide in order to program the memory cell (i.e., store a "1" therein). Specifically, a relatively high write voltage is applied to a gate of a CTFET in a selected memory cell through a wordline and the sense amplifier determines a voltage differential between the pair of adjacent bitlines connected to the selected memory cell. These processes are repeated until the occurrence of a desired voltage differential is verified, thereby indicating that the selected memory cell is programmed. During an erase operation for a previously programmed memory cell, a reverse field is applied so that the memory cell is no longer programmed. Those skilled in the art will recognize that the injected charge in a charge trap field effect transistor will, however, decrease over time and this charge loss can eventually result in a read error (e.g., can eventually result in a memory cell being read as unprogrammed ("0") instead of programmed ("1")).

SUMMARY

Disclosed herein are embodiments of a memory array configured with a combination of charge trap memory cells and distributed charge trap reference cells to enable single-ended current sensing of the memory cells, programming of the memory cells using a margin testing technique that limits overwriting, and optionally de-programming (i.e., erasing of the memory cells).

Specifically, the memory array can include memory cells (e.g., charge trap memory cells including one or more charge trap field effect transistors (CTFET(s)) arranged in rows and columns. The memory array can further include reference cells and comparators with each column of memory cells having a corresponding reference cell and a corresponding comparator.

Each memory cell in a given row and a given column can have a first terminal (e.g., a gate terminal) electrically connected to a common memory wordline for the given row, a second terminal (e.g., a drain terminal) electrically connected to a common memory bitline for the given column and a third terminal (e.g., a source terminal) electrically connected to ground.

Each reference cell can be essentially identical in structure to a memory cell. Each reference cell for a given column can have a first terminal (e.g., a gate terminal) electrically connected to a common reference wordline for all of the reference cells, a second terminal (e.g., a drain terminal) electrically connected to a reference bitline for the reference cell, and a third terminal (e.g., a source terminal) electrically connected to ground.

Each comparator for a given column can be configured to output a digital signal, which indicates a current differential between currents conducted by the reference cell for that given column and by a selected memory cell in the given column. Specifically, the digital signal can indicate whether the current flowing through the selected memory cell is above or below a reference current amount (i.e., the current flowing through the reference cell).

To accomplish this, each comparator can include a current mirror and a secondary comparator circuit. The current mirror can have a reference section (also referred to as a reference leg) and a memory section (also referred to as a memory leg). The reference section can include a reference cell input node electrically connected to a specific reference bitline and, thereby to a specific reference cell (i.e., the reference cell for the given column). The reference section can further include a current mirror node, which is electrically connected to all of the current mirror nodes across all of the comparators in order to balance out threshold voltage differences across the reference cells. The memory section can include a memory cell input node and an output voltage node. The memory cell input node can be electrically connected to a specific common memory bitline for the given column and, thereby to all the memory cells in the given column. In response to different currents flowing through the reference cell and a selected memory cell, the current mirror will output different analog voltages and, particularly, a current mirror voltage and an output voltage at the current mirror node and the output voltage node, respectively. The secondary comparator circuit compares these different analog voltages and outputs a digital signal at a digital output node indicating the voltage differential. The value of the digital signal at the digital output node will vary depending upon the voltage differential between the current mirror voltage and the output voltage.

In addition to the features described above, embodiments of the memory array can further include: a wordline voltage generator that generates a memory wordline voltage; wordline decoders that apply the memory wordline voltage to memory wordlines; a reference wordline voltage generator that generates a reference wordline voltage; and a reference wordline decoder that applies the reference wordline voltage to the reference wordline. The levels of the memory wordline voltage and the reference wordline voltage generated by the memory wordline voltage generator and the reference wordline voltage generator applied to the memory wordlines and the reference wordline, respectively, can be selectively varied depending upon whether read, write or optional erase operations are being performed. For example, during a read operation to determine whether a selected memory cell is unprogrammed or programmed, the reference wordline voltage generator can set the reference wordline voltage at a first level sufficient to ensure that each reference cell conducts a reference current that is approximately midway between a first current amount expected to be conducted by an unprogrammed memory cell and a second current amount, which is less than the first current amount, and expected to be conducted by a programmed memory cell. During a write operation to program the selected memory cell, the reference wordline voltage generator can set the reference wordline voltage at a second level that is lower than the first level to facilitate margin testing.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

Figure 1:
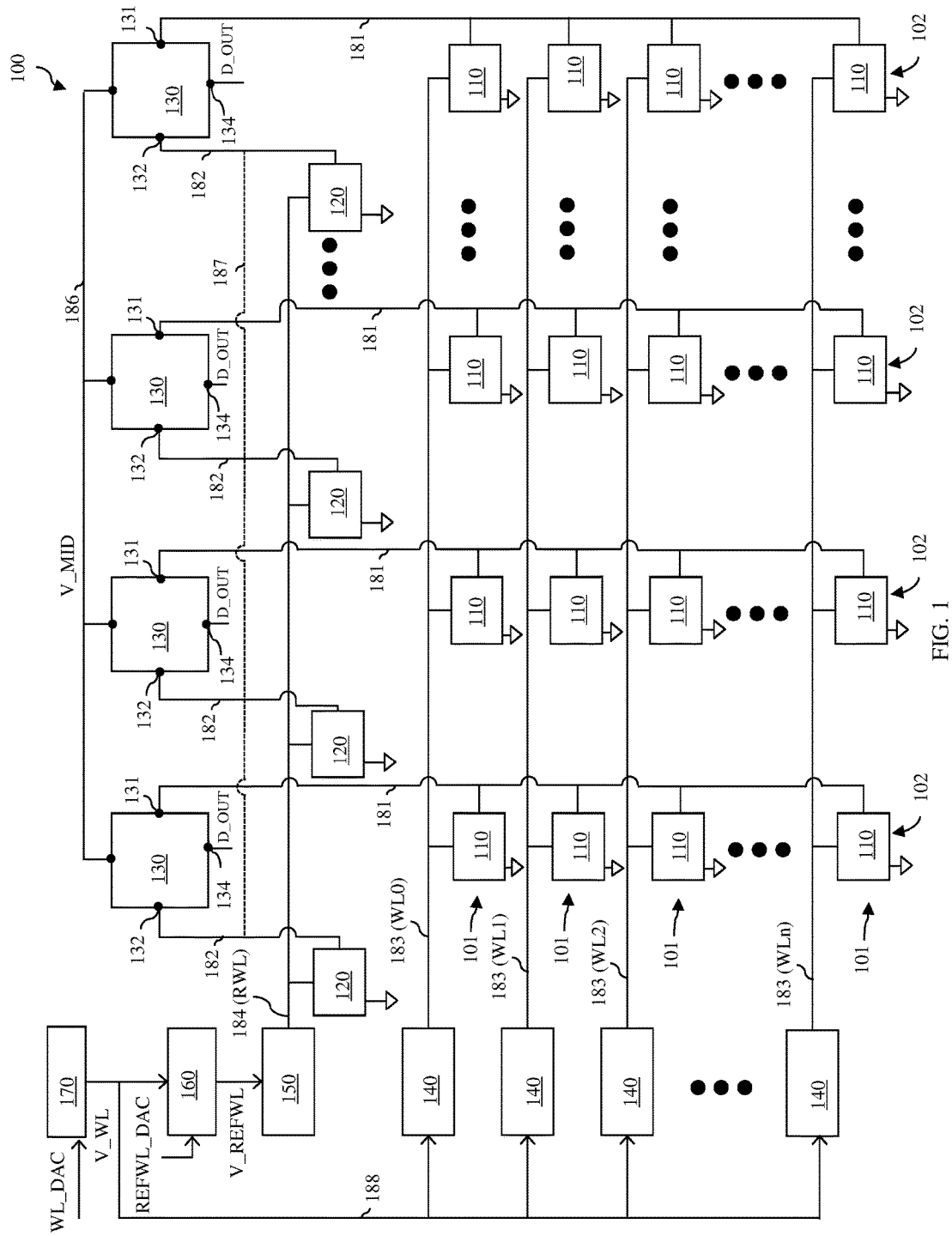
FIG. 1 is a schematic diagram illustrating a disclosed embodiment of a memory array.

As mentioned above, the injected charge in a charge trap field effect transistor (CTFET) of a memory cell will decrease over time and this charge loss can eventually result in a read error (e.g., can eventually result in the memory cell being read as unprogrammed ("0") instead of programmed ("1")). A margin testing technique could be employed where a higher than necessary charge is injected into the gate or gate oxide during the write operation to compensate for the expected charge loss. For example, if a differential of 50 mV is required for the memory cell to be read by a sense amplifier as programmed, a margin testing technique could be performed wherein a high voltage is repeatedly applied to the gate of the CTFET until a differential of 100 mV (not 50 mV) is verified. Unfortunately, overwriting the memory cell and, particularly, repeatedly applying a higher than necessary voltage to the memory cell can damage the memory cell (e.g., can lead to time dependent dielectric breakdown (TDDB)). Furthermore, such a margin testing technique may not be sufficiently accurate to prevent read errors.

In view of the foregoing, disclosed herein are embodiments of a memory array with distributed charge trap reference cells that enable single-ended current sensing of charge trap memory cells. The memory array can be a one-time programmable memory (OTPM) array or can include an optional erase function so that it is a multiple time programmable memory (MTPM) array. In any case, the memory array includes memory cells, reference cells, and comparators. The memory cells are arranged in rows and columns with each column having a corresponding reference cell and a corresponding comparator. Each memory cell in a given row and a given column has terminals connected to a common memory wordline for the given row, to a common memory bitline for the given column, and to ground, respectively. Each reference cell for a given column has terminals connected to a common reference wordline for all the reference cells, to a reference bitline for the reference cell, and to ground, respectively. Each comparator for a given column has a current mirror with a reference section and a memory section. The reference section is connected to a reference bitline and thereby the reference cell for the given column and the memory section is connected to a common memory bitline and thereby the memory cells in the given column. Additionally, each reference section has a current mirror node and all of the current mirror nodes of all of the comparators in the memory array are electrically connected to balance out process variations across the reference cells. Each comparator compares currents conducted by a reference cell and by a selected memory cell during a read operation to determine the programming state of the cell, during a write operation to verify programming, and optionally during an erase operation to verify erasing. Voltages applied to the memory wordlines and the reference wordline are selectively varied, as discussed in greater detail below, in order to enable single-ended current sensing of the memory cells, programming of the memory cells using a margin testing technique that limits overwriting, and optionally de-programming (i.e., erasing) of the memory cells. It should be noted that by electrically connecting the current mirror nodes in the reference sections of all of the comparators across the memory array, the disclosed configuration balances out process variations across the reference cells and other devices within the reference sections of the current mirrors and, as a result, reduces the effects of mismatch and increases sensing accuracy.

More particularly, referring to FIG. 1, disclosed herein are embodiments of a memory array 100. This memory array 100 can include memory cells 110, memory bitlines 181, memory wordlines 183, memory wordline decoders 140 (i.e., row address decoders) and a memory wordline voltage generator 170 (e.g., a digital to analog converter (DAC)). This memory array 100 can further include reference cells 120, reference bitlines 182, a single reference wordline 184, a reference wordline decoder 150 and a reference wordline voltage generator 160. The array 100 can further include comparators 130.

Specifically, the memory cells 110 can be arranged in rows 101 and columns 102. Each row 101 of memory cells 110 can share a single common memory wordline 183. The common memory wordline 183 can be connected by a corresponding memory wordline decoder 140 to the memory wordline voltage generator 170 (e.g., via connector 188). In operation, the memory wordline voltage generator 170 receives a wordline DAC input signal (WL_DAC) and, based on that signal, sets the memory wordline voltage (V_WL). The memory wordline decoders 140 receive decoding inputs (i.e., address bits) identifying a selected memory wordline 183 and, in response, the memory wordline voltage (V_WL) is applied by the appropriate memory wordline decoder 140 to that selected memory wordline 183. Each column 102 of memory cells 110 can share a single common memory bitline 181 and, at one end, can have a corresponding reference cell 120 and a corresponding comparator 130, as illustrated.

Figure 2:
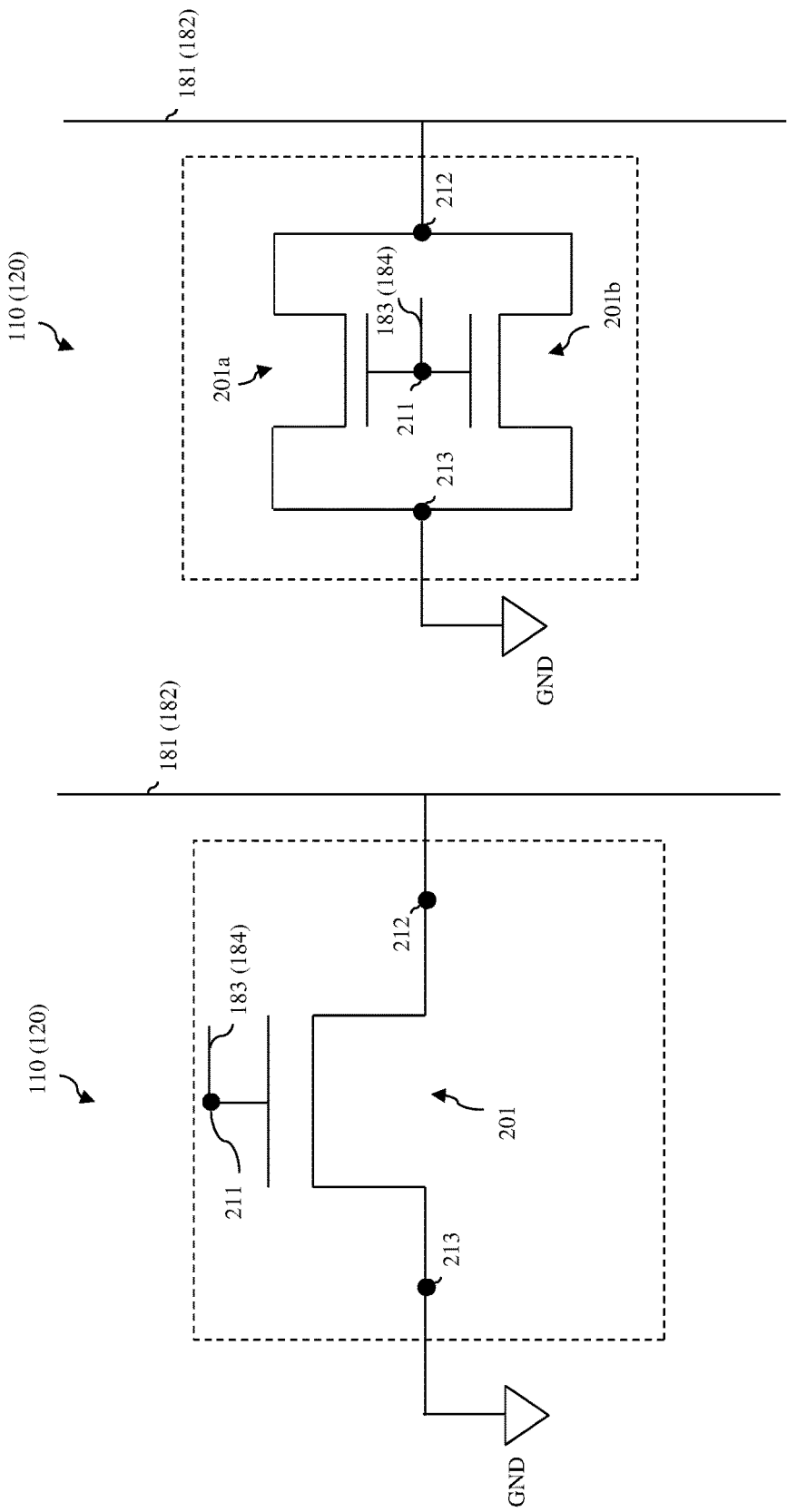
FIGS. 2A and 2B are schematic diagrams illustrating different exemplary memory cells that can be incorporated into the memory array of FIG. 1.

Each memory cell 110 can be a charge trap memory cell that includes at least one charge trap field effect transistor (CTFET). For example, referring to FIG. 2A, each memory cell 110 can include a single, relatively large, N-type CTFET 201 with three terminals including: a first terminal 211 and, particularly, a gate terminal; a second terminal 212 and, particularly, a drain terminal; and a third terminal 213 and, particularly, a source terminal. Alternatively, referring to FIG. 2B, each memory cell 110 can include multiple, smaller, N-type CTFETs (e.g., 201a-201b) electrically connected in parallel and having three common terminals including: a common first terminal 211 and, particularly, a common gate terminal, where all gates of all CTFETs in the cell are shorted together; a common second terminal 212 and, particularly, a common drain terminal, where all drains of all CTFETs in the cell are shorted together; and a common third terminal 213 and, particularly, a common source terminal, where all sources of all CTFETs in the cell are shorted together. In any case, the first terminal 211 (e.g., the gate terminal) of each memory cell 110 in any given row can be electrically connected to a common memory wordline 183 for that row. The second terminal 212 (e.g., the drain terminal) of each memory cell 110 in any given column can be electrically connected to a common memory bitline 181 for that column. Finally, the third terminal 213 (e.g., the source terminal) of all memory cells can be electrically connected to ground.

The reference cells 120 can be arranged a single row with each reference cell 120 being at the end of a corresponding column 102 of memory cells 110. The row of reference cells 120 can share a single common reference wordline 184. The common reference wordline 184 can be connected by the reference wordline decoder 150 to the reference wordline voltage generator 160. The reference wordline voltage generator 160 can further be connected to the memory wordline voltage generator 170. As mentioned above, in operation, the memory wordline voltage generator 170 receives a wordline DAC input signal (WL_DAC) and, based on that signal, sets the memory wordline voltage (V_WL). Additionally, the reference wordline voltage generator 160 receives a reference wordline DAC input signal (REFWL_DAC) and, based on that signal as well as the memory wordline voltage (V_WL) output from the memory wordline voltage generator 170, sets the reference wordline voltage (V_REFWL) that is applied by the reference wordline decoder 150 to the reference wordline 184. Each reference cell 120 associated with a given column 102 of memory cells can further be electrically connected by a discrete reference bitline 182 to the corresponding comparator 130 for the column 102. Optionally, all reference bitlines 182 connecting reference cells 120 to comparators 130, respectively, can be electrically connected (e.g., by reference bitline connector 187).

The reference cells 120 can be essentially identical in structure to the memory cells 110. That is, each reference cell 120 can be a charge trap reference cell that includes at least one charge trap field effect transistor (CTFET) (e.g., at least one N-type CTFET). For example, referring to FIG. 2A, each reference cell 120 can include a single, relatively large, N-type CTFET 201 with three terminals including: a first terminal 211 and, particularly, a gate terminal; a second terminal 212 and, particularly, a drain terminal; and a third terminal 213 and, particularly, a source terminal. Alternatively, referring to FIG. 2B, each reference cell 120 can include multiple, smaller, N-type CTFETs (e.g., 201a-201b) electrically connected in parallel and having three common terminals including: a common first terminal 211 and, particularly, a common gate terminal, where all gates of all CTFETs in the cell are shorted together; a common second terminal 212 and, particularly, a common drain terminal, where all drains of all CTFETs in the cell are shorted together; and a common third terminal 213 and, particularly, a common source terminal, where all sources of all CTFETs in the cell are shorted together. However, the first terminal 211 (e.g., the gate terminal) of each of the reference cells 120 can be electrically connected to the same common reference wordline 184. The second terminal 212 (e.g., the drain terminal) of each reference cell 120 associated with a given column can be electrically connected to a reference bitline 182. Finally, the third terminal 213 (e.g., the source terminal) of all reference cells 120 can be electrically connected to ground.

Each comparator 130 for a given column 102 can include a memory cell input node 131, a reference cell input node 132 and a digital output node 134. The memory cell input node 131 can be electrically connected to a common memory bitline 181 and, thereby each of the memory cells 110 in the given column 102. The reference cell input node 132 can be electrically connected to a discrete reference bitline 182 and, thereby to the corresponding reference cell 120 for the given column. Each comparator 130 can further be configured to compare currents being conducted by the reference cell 120 (via the reference cell input node 132 and reference bitline 182) and by a selected memory cell 110 (via the memory cell input node 131 and common memory bitline 181 and, in response, can output a digital signal (D-OUT) at a digital output node 134 that is indicative of a current differential. Specifically, the digital signal (D-OUT) indicates whether the amount of current conducted by the selected memory cell 110 is greater than or less than the amount of current conducted by the reference cell 120.

Figure 3:
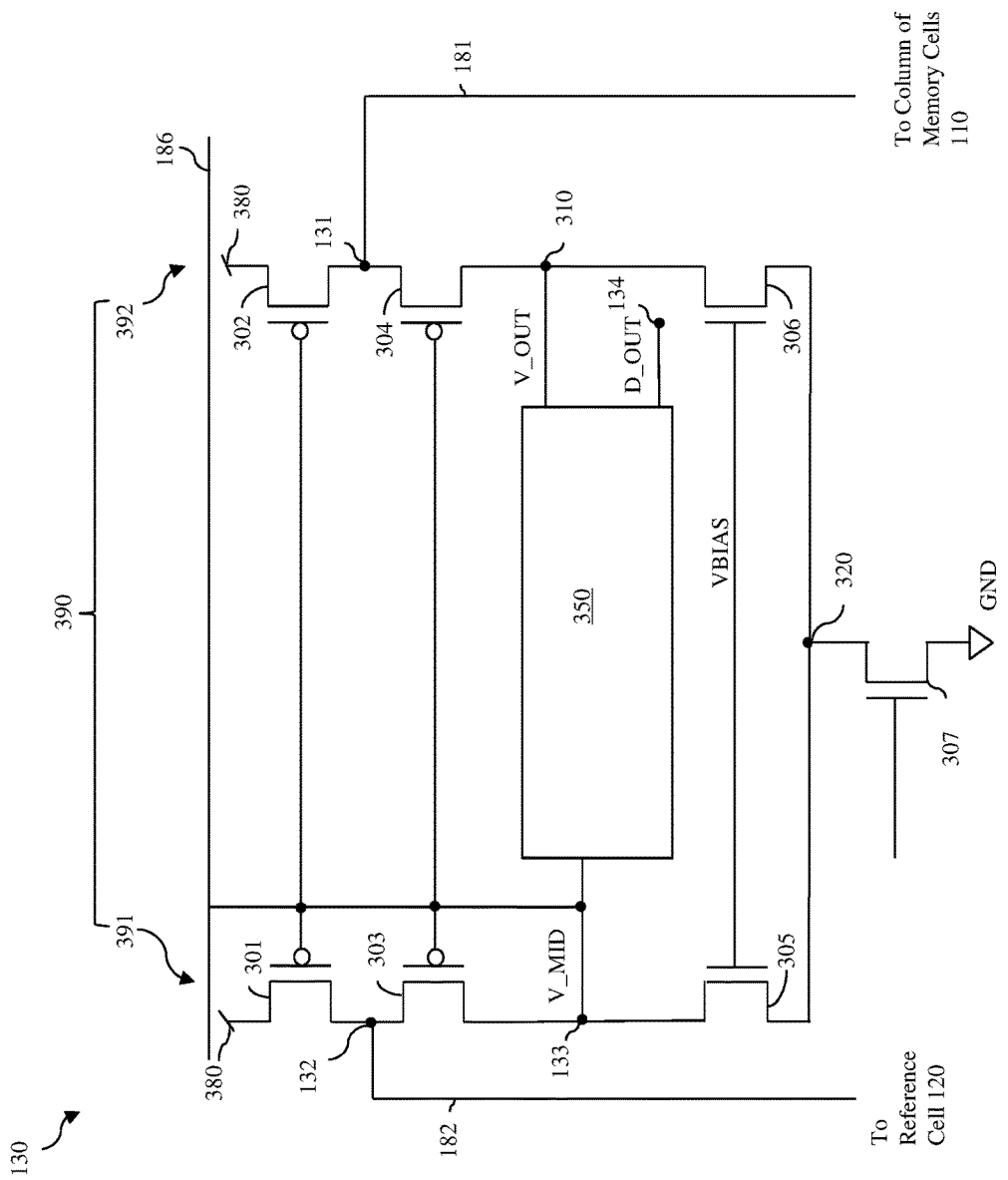
FIG. 3 is a schematic diagram illustrating an exemplary comparator that can be incorporated into the memory array of FIG. 1.

FIG. 3 is a schematic drawing illustrating an exemplary comparator 130 that can be incorporated into the memory array 100 of FIG. 1. Specifically, each comparator 130 for a given column 102 can include a current mirror 390 and a secondary comparator circuit 350.

The current mirror 390 can include a reference section 391 and a memory section 392.

The reference section 391 can include, for example, two first P-type field effect transistors (PFETs) 301, 303 and a first N-type field effect transistor (NFET) 305 electrically connected in series between a supply voltage 380 and a pull-down node 320. The reference section 391 can further include a reference cell input node 132 at the junction between the two first PFETs 301, 303. This reference cell input node 132 can further be electrically connected to a specific reference bitline 182 and, thereby to a specific reference cell 120 for the given column. The reference section 391 can further include a current mirror node 133 at the junction between the first PFET 303 and the first NFET 305.

The memory section 392 can include two second PFETs 302, 304 and a second NFET 306 electrically connected in series between the supply voltage 380 and the same pull-down node 320. The pull-down node 320 can be electrically connected to ground through a footer device 307 (e.g., an additional NFET). The memory section 392 can further include a memory cell input node 131 at the junction between the two second PFETs 302, 304. This memory cell input node 131 can further be electrically connected to a specific common memory bitline 181 and, thereby to all the memory cells 110 in the given column. The memory section 392 can further include an output voltage node 310 at the junction between the second PFET 304 and the second NFET 306.

The current mirror node 133 of the reference section 391 can further be electrically connected to the gates of both of the first PFETs 301, 303 within that reference section 391 and the gates of both of the second PFETs 302, 304 within the memory section 392. Thus, the current mirror voltage (V_MID) at the current mirror node 133 controls current flow through the PFETs 301-304. Additionally, the current mirror nodes 133 in the current mirrors 390 of all of the comparators 130 can be electrically connected (e.g., by current mirror node connector 186). By shorting together the current mirror nodes 133 using the current mirror node connector 186, the memory array configuration balances out process variations and, particularly, averages threshold variations across the reference cells 120 and first PFETs 301 and 303. In other words, the current mirror voltage (V_MID) at the current mirror node 133 in the current mirror 390 of any comparator 130 in the array will be highly invariant to threshold voltage variations in the reference cells 120 or in the first PFETs 301, 303 of the reference sections 391 across the array. As a result, the disclosed configuration reduces the effects of mismatch and increases sensing accuracy.

In operation, in the reference section 391 of the current mirror 390, current conducted through the first PFET 301, into the specific reference bitline 182 and further into the specific reference cell 120 (which is electrically connected to reference cell input node 132 by the specific reference bitline 182) results in a current mirror voltage (V_MID) on the current mirror node 133 of the reference section 391. This current mirror voltage (V_MID) controls the gates of the first PFETs 301 and 303 in the reference section 391 as well as the gates of the second PFETs 302 and 304 of the memory section 392. Additionally, in the memory section 392 of the current mirror 390, current conducted through the second PFET 302, into the specific common memory bitline 181 and further into a selected memory cell 110 (which is electrically connected to the memory cell input node 131 by the specific common memory bitline 181) results in an output voltage (V_OUT) at the output voltage node 310. The voltage differential between the current mirror voltage (V_MID) at the current mirror node 133 and the output voltage (V_OUT) at the output voltage node 310 will be indicative of the current differential between the currents conducted by the reference cell 120 and the selected memory cell 110.

The secondary comparator circuit 350 compares these different analog voltages (i.e., the current mirror voltage at the current mirror node 133 and the output voltage at the output voltage node 310) and outputs a digital signal (D-OUT) at a digital output node 134 indicating the voltage differential. That is, the value of the digital signal (D-OUT) at the digital output node 134 will vary depending upon the voltage differential between the current mirror voltage (V_MID) and the output voltage (V_OUT) and, particularly, will switch depending upon whether the output voltage (V_OUT) is above or below the current mirror voltage (V_MID).

Figure 4A:
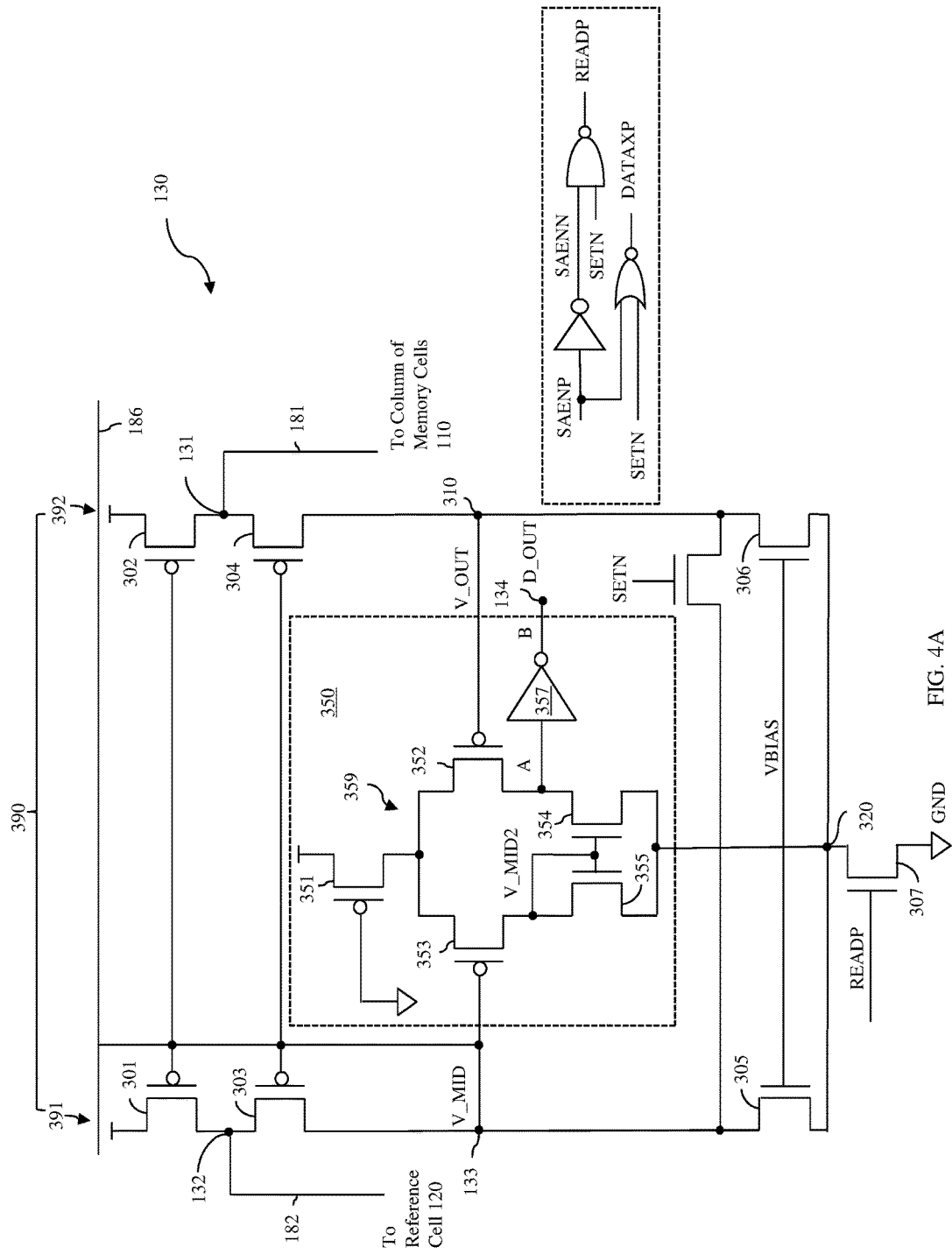
FIG. 4A is a schematic diagram illustrating another exemplary comparator that can be incorporated into the memory array of FIG. 1.

FIG. 4A is a more detailed schematic drawing illustrating the comparator 130 of FIG. 3 including an exemplary secondary comparator circuit 350 that can be incorporated therein. The exemplary secondary comparator circuit 350 includes a differential amplifier 359 (e.g., see the exemplary differential amplifier 359 that includes FETs 351-355) and an inverter 357 connected in series to an output node (node A) of the differential amplifier 359. The differential amplifier 359 receives, as inputs, the current mirror voltage (V_MID) from the current mirror node 133 and the output voltage (V_OUT) from the output voltage node 310 and outputs an output signal at the output node A. The inverter 357 inverts the output signal, outputting an inverter output signal (i.e., the digital signal (D_OUT)) at the digital output node 134 (i.e., node B). Inverter 357 inputs near-digital levels on node A and converts them to full CMOS levels at node B. The value of the digital signal (D_OUT) will vary depending upon the voltage differential between the current mirror voltage (V_MID) and the output voltage (V_OUT) from the current mirror 390 and this voltage differential will vary depending upon the current differential between currents conducted by the specific reference cell 120 connected to the specific reference bitline 182 and by a selected memory cell 110 connected to the specific common memory bitline 181.

Figure 4B:
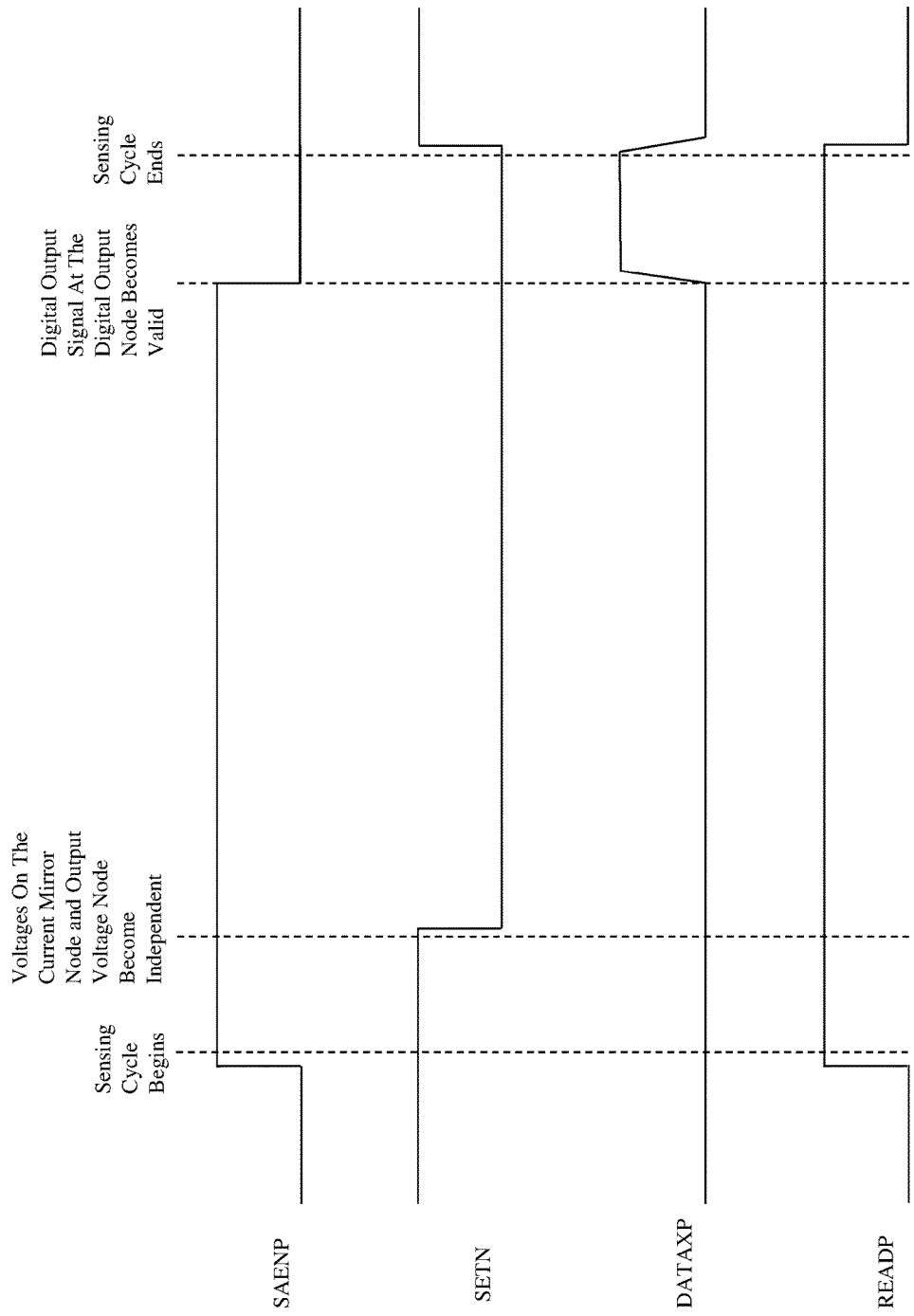
FIG. 4B is a timing diagram showing levels of control signals employed during operation of the comparator of FIG. 4A.

FIG. 4B is an exemplary timing diagram illustrating various control signal levels at different times during operation of the comparator of FIG. 4A. Specifically, referring to FIGS. 4A and 4B in combination, control signals for the comparator can include SAENP, SETN, DATAXP, and READP. Input SAENP activates the sensing cycle when it goes high. Input SETN starts out high and shunts the current mirror node 133 to the output voltage node 310 to equalize the voltages on these two nodes prior to sensing. When input SETN goes low, the equalization operation is terminated and input READP goes high to activate the footer device 307, providing a conduction path to ground through current source NFETs 305 and 306, which are controlled by a bias voltage (i.e., a VBIAS supply level). It should be understood that VBIAS may be derived from an on-chip bandgap current source or from any other suitable source. At this point, the differential current flowing in the reference cell input node 132 and memory cell input node 131 from the reference cell 120 and memory cell 110, respectively, generates a voltage differential on the current mirror node 133 and the output voltage node 310, respectively. This voltage differential is representative of the data type stored in memory cell 110. A programmed cell causes the output voltage (V_OUT) at the output voltage node 310 to be higher than the current mirror voltage (V_MID) at the current mirror node 133, whereas an unprogrammed cell causes V_OUT to be lower than V_MID. The differential voltage (V_MID, V_OUT) provides input to the secondary comparator circuit 350, which further amplifies this difference close to a full Vdd level signal at node A. The inverter 357 converts the voltage level at node A to either a full 0-volt, or a full Vdd-level digital signal level. Upon completion of this data amplification operation, SAENP goes low and output strobe DATAXP goes high indicating the data on the digital output node 134 (i.e., node B) is valid. At the end of the sense cycle, SETN returns high and DATAXP and READP go low before beginning a subsequent sense operation.

It should be understood that the secondary comparator circuit 350 shown in FIG. 4A is provided for illustration purposes and is not intended to be limiting. Alternatively, any other secondary comparator circuit configured to output a digital signal (D_OUT) indicating the voltage differential between V_MID and V_OUT could be used.

With the above-discussed configuration, the levels of the memory wordline voltage (V_WL) and the reference wordline voltage (V_REFWL), which are generated by the memory wordline voltage generator 170 and the reference wordline voltage generator 160 and applied to a selected memory wordline and the reference wordline, respectively, can be selectively varied depending upon whether read, write or optional erase operations are being performed. Specifically, as discussed in greater detail below, the levels of the memory wordline voltage (V_WL) and the reference wordline voltage (V_REFWL) can be varied in order to achieve the following: (1) accurate single-ended current sensing of memory cells during read operations to determine if selected memory cells are programmed or unprogrammed, during write operations to verify programming of selected memory cells, and during erase operations to verify de-programming of selected memory cells; (2) programming of selected memory cells during write operations using a margin testing technique that compensates for charge loss while limiting overwriting; and (3) in the case of a multiple-time programmable memory (MTPM), de-programming of selected memory cells during erase operations.

It should be noted that unprogrammed memory cells in the memory array 100 will have a first threshold voltage and will be expected to conduct a first current amount, whereas programmed memory cells in the memory array 100 will have a second threshold voltage that is greater than the first threshold voltage and will be expected to conduct a second current amount that is less than the first current amount.

Thus, for example, during a read operation to determine whether a selected memory cell is unprogrammed or programmed, the memory wordline voltage (V_WL) that is generated by the memory wordline voltage generator 170 can be set (e.g., by applying an appropriate WL_DAC signal) to some predetermined read voltage level (V_READ) that is above (e.g., 50-100 mV above) the second threshold voltage for a programmed memory cell. Additionally, the reference wordline voltage (V_REFWL) that is generated by the reference wordline voltage generator 160 can be set (e.g., by applying an appropriate REFWL_DAC) at a first reference wordline voltage level (V_REFREAD) that is sufficient to ensure that a corresponding reference cell (i.e., the reference cell connected to the same comparator as the selected memory cell) will conduct a reference current amount that is midway between the first current amount expected to be conducted by the selected memory cell being read when that selected memory cell is unprogrammed and the second current amount expected to be conducted by the selected memory cell being read when that selected memory cell is programmed. Depending upon the current differential between the currents conducted by the reference cell 120 and the selected memory cell 110, the current mirror 390 will output different voltages and, particularly, a current mirror voltage (V_MID) at the current mirror node 133 and an output voltage (V_OUT) at the output voltage node 310. The secondary comparator circuit 350 then compares the current mirror voltage (V_MID) to the output voltage (V_OUT) and outputs a digital signal (D-OUT) at the digital output node 134 indicating the voltage differential.

More specifically, cell overdrive (Vgs-Vt) is determined by the V_WL level used during the read operation (i.e., VREAD) and by the threshold voltage of the selected memory cell 110 being read. As mentioned above, this threshold voltage will be lower if the memory cell is unprogrammed and higher if the memory cell is programmed. Thus, for a given VREAD level, there exists a '0' cell current level and a '1' cell current level. For example, given V_READ on the memory wordline 183 and V_REFREAD on the reference wordline, when the current mirror voltage (V_MID) is greater than the output voltage (V_OUT) indicating that the amount of current conducted by the reference cell 120 is less than the amount of current conducted by the selected memory cell 110, then the digital signal (D_OUT) at the digital output node 134 will go low indicating that the selected memory cell is unprogrammed (i.e., stores a "0"). However, if the current mirror voltage (V_MID) is less than the output voltage (V_OUT) indicating that the amount of current conducted by the reference cell 120 is greater than the amount of current conducted by the selected memory cell 110, then the digital signal (D_OUT) at the digital output node 134 will go high indicating that the selected memory cell 110 is programmed (i.e., stores a "1").

During a write operation, a memory cell 110 is programmed by injecting a charge into the first terminal 211 (see FIG. 2A or 2B) and, particularly, into the gate or gate oxide of the gate terminal to increase the threshold voltage of the CTFET(s) in the memory cell 110. Specifically, as mentioned above, an unprogrammed memory cell will have a first threshold voltage and is expected to conduct a first current amount. During a write operation, the memory wordline voltage (V_WL) that is generated by the memory wordline voltage generator 170 is set (e.g., by applying an appropriate WL_DAC signal) at some predetermined write voltage level (V_WRITE) that is above the read voltage level (V_READ) and that is sufficiently high to inject a charge into the first terminal 211 and, particularly, into the gate or gate oxide of the gate terminal of the selected memory cell 110 being programmed. Injection of the charge increases the threshold voltage to at least a second threshold voltage that is greater than the first threshold voltage and, as a result, the programmed memory cell is expected to conduct no more than a second current amount that is less than the first current amount during a read operation when V_WL is set at V_READ. The relatively high write voltage is applied to the first terminal, until such time as the comparator 130 verifies that the selected memory cell 110 has been programmed.

It should be noted the the reference wordline voltage (V_REFWL) applied to the reference wordline 184 during the write operation and used to verify that the selected memory cell 110 has been programmed could be the same as that used during the read process.

Alternatively, the reference wordline voltage (V_REFWL) can be shifted to enable a unique margin testing technique to be performed. With this margin testing technique, instead of increasing the threshold voltage of a selected memory cell to a baseline threshold voltage level sufficient to enable the selected memory cell to be read as programmed during a read operation, the threshold voltage is increased beyond that baseline threshold voltage level to some higher target threshold level. To accomplish this, when verifying whether or not the selected memory cell 110 has been programmed during this write operation, the reference wordline voltage (V_REFWL) is set (e.g., by applying an appropriate REFWL_DAC) at some predetermined second reference wordline voltage level (V_REFWRITE) that is different from the predetermined first reference wordline voltage level (V_REFREAD) used during the read operation (as discussed above). The predetermined second reference wordline voltage level (V_REFWRITE) is specifically less than the predetermined first reference wordline voltage level (V_REFREAD) so that the reference cell 120, which is connected to the same comparator 130 as the selected memory cell 110 being programmed, conducts a reference current amount during the write operation that is lower than what it would otherwise conduct during a read operation. That is, the predetermined second reference wordline voltage level (V_REFWRITE) can be set so that the reference current amount during the write operation is closer to the lower second current amount associated with programmed memory cells, than it is to the higher first current amount associated with unprogrammed memory cells. As a result, more charge will have to be injected into the first terminal 211 of the memory cell 110 before the required voltage differential sufficient for the digital signal (D_OUT) to switch from low to high, indicating that the memory cell has been properly programmed. Specifically, during the write operation, the level of the reference wordline voltage (V_REFWL) can be decreased to V_REFWRITE from V_REFREAD by an amount equal to the desired margin test in millivolts (i.e., by an amount equal to the desired additional charge to be injected into the first terminal 211 of the memory cell). Margin testing accuracy is ensured using this technique because there is a 1:1 relationship between the amount by which the reference wordline voltage level (V_WL) is decreased during the write operation (i.e., the difference between V_REFREAD and V_REFWRITE) and the margin voltage amount (i.e., the additional charge amount injected into the gate or gate oxide of the gate terminal 211 to compensate for subsequent charge loss).

As mentioned above, the disclosed memory array can be a one-time programmable memory (OTPM), wherein once a memory cell is programmed it remains programmed. Alternatively, the disclosed memory array can be configured to enable de-programming of the memory cells such that it is a multiple-time programmable memory (MTPM) array. In this case, during an erase operation, a memory cell 110 is de-programmed (i.e., erased) by removing the injected charge from the first terminal 211 (see FIG. 2A or 2B) and, particularly, from the gate or gate oxide of the gate terminal to decrease the threshold voltage of the CTFET(s) in the memory cell 110. In this case, the memory wordline voltage (V_WL) that is generated by the memory wordline voltage generator 170 is set (e.g., by applying an appropriate WL_DAC signal) at some predetermined erase voltage level (V_ERASE) that is essentially the opposite of the write voltage level (i.e., a reverse field) to reverse the charge in the first terminal 211. V_ERASE is applied to the first terminal until such time as the comparator 130 verifies that the selected memory cell 110 has been de-programmed. The reference wordline voltage (V_REFWL) applied to the reference wordline 184 during the erase operation and used to verify that the selected memory cell 110 has been programmed could be the same as that used during the read process. Alternatively, the reference wordline voltage (V_REFWL) can be shifted to enable unique margin testing. In this case, when verifying whether or not the selected memory cell 110 has been de-programmed during this erase operation, the reference wordline voltage is set (V_REFWL) (e.g., by applying an appropriate REFWL_DAC) at some predetermined third reference wordline voltage level (V_REFERASE). The predetermined third reference wordline voltage level (V_REFERASE) is specifically greater than the predetermined first reference wordline voltage level (V_REFREAD) so that the reference cell 120, which is connected to the same comparator 130 as the selected memory cell 110 being programmed, conducts a reference current amount during the erase operation that is higher than what it would otherwise conduct during a read operation.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. For example, the invention disclosed herein includes a single-ended sensing reference and further provides a single-ended signal margining technique. The embodiments described and illustrated in the Figures are configured with memory cells that are charge trap NFET memory cells. The description and Figures are not intended to be limiting. It should be understood that the memory cells could, alternatively, be charge trap PFET memory cells. Furthermore, it should be understood that the charge trap NFET memory cells could, alternatively, be configured differently. In either case (i.e., in the case of charge trap PFET memory cells or in the case of charge trap NFET memory cells with different configurations), it is anticipated that the practice of applying NFET-PFET duals to the disclosed circuits can be applied. In such applications, NFETS may be exchanged for PFETs and visa-versa, and supply levels may be exchanged or altered. For example, the concepts describing comparator 130 can easily be implemented with PFET or NFET current mirrors and differential amplifier techniques. In any case, the terminology used herein was chosen to best explain the principles of the embodiments, the practical application or technical improvement over technologies found in the marketplace, or to enable others of ordinary skill in the art to understand the embodiments disclosed herein.

Therefore, disclosed above are embodiments of a memory array with distributed charge trap reference cells that enable single-ended current sensing of charge trap memory cells. This memory array can be a one-time programmable memory (OTPM) array or can include an optional erase function so that it is a multiple time programmable memory (MTPM) array. In any case, the memory array includes memory cells, reference cells, and comparators. The memory cells are arranged in rows and columns with each column having a corresponding reference cell and a corresponding comparator. Each memory cell in a given row and a given column has terminals connected to a common memory wordline for the given row, to a common memory bitline for the given column, and to ground, respectively. Each reference cell for a given column has terminals connected to a common reference wordline for all the reference cells, to a reference bitline for the reference cell, and to ground, respectively. Each comparator for a given column has a current mirror with a reference section and a memory section. The reference section is connected to a reference bitline and thereby the reference cell for the given column and the memory section is connected to a common memory bitline and thereby the memory cells in the given column. Additionally, each reference section has a current mirror node and all of the current mirror nodes of all of the comparators in the memory array are electrically connected. Each comparator circuit compares currents conducted by a reference cell and by a selected memory cell during a read operation to determine the programming state of the cell, during a write operation to verify programming, and optionally during an erase operation to verify erasing. Voltages applied to the memory wordlines and the reference wordline are selectively varied, as discussed, in order to enable single-ended current sensing of the memory cells, programming of the memory cells using a margin testing technique that limits overwriting, and optionally de-programming (i.e., erasing) of the memory cells. As discussed above, by electrically connecting the current mirror nodes in the reference sections of all of the comparators across the memory array, the disclosed configuration balances out process variations across the reference cells and other devices within the reference sections of the current mirrors and, as a result, reduces the effects of mismatch and increases sensing accuracy.

What is claimed is:

1. A memory array comprising:
   memory cells, wherein each memory cell has a first terminal connected to a common memory wordline for a row of the memory cells and a second terminal connected to a common memory bitline for a column of the memory cells;
   reference cells, wherein each reference cell has a first terminal connected to a common reference wordline and a second terminal connected to a reference bitline; and
   comparators, wherein each comparator comprises a current mirror comprising:
      a reference section comprising a reference cell input node and a current mirror node, wherein the reference cell input node is electrically connected by a specific reference bitline to a specific reference cell and wherein a current mirror node connector electrically connects all current mirror nodes of all of the comparators; and
      a memory section comprising a memory cell input node and an output voltage node, wherein the memory cell input node is electrically connected to a specific common memory bitline for a specific column of the memory cells.

2. The memory array of claim 1,
   wherein the reference section comprises two first P-type field effect transistors and a first N-type field effect transistor electrically connected in series between a supply voltage and a pull-down node,
   wherein the reference cell input node is at a junction between the two first P-type field effect transistors and the current mirror node is at a junction between one of the two first P-type field effect transistors and the first N-type field effect transistor,
   wherein the memory section comprises two second P-type field effect transistors and a second N-type field effect transistor electrically connected in series between the supply voltage and the pull-down node,
   wherein the memory cell input node is at a junction between the two second P-type field effect transistors and the output voltage node is at a junction between one of the two second P-type field effect transistors and the second N-type field effect transistor,
   wherein gates of the two first P-type field effect transistors and the two second P-type field effect transistors are controlled by a current mirror voltage at the current mirror node, and
   wherein gates of the first N-type field effect transistor and the second N-type field effect transistor are controlled by a bias voltage, and
   wherein an additional N-type field effect transistor electrically connects the pull-down node to ground.

3. The memory array of claim 1, wherein each comparator further comprises a secondary comparator circuit that compares an output voltage at the output voltage node and a current mirror voltage at the current mirror node and that outputs a digital signal at a digital output node, wherein a value of the digital signal varies depending upon a voltage differential between the current mirror voltage and the output voltage and wherein the voltage differential depends upon a current differential between currents conducted by the specific reference cell connected to the specific reference bitline and by a selected memory cell connected to the specific common memory bitline.

4. The memory array of claim 1, wherein each comparator further comprises a secondary comparator circuit comprising:
   a differential amplifier that receives, as inputs, a current mirror voltage from the current mirror node and an output voltage from the output voltage node; and
   an inverter connected in series to the differential amplifier and that outputs a digital signal at a digital output node, wherein a value of the digital signal varies depending upon a voltage differential between the current mirror voltage and the output voltage and wherein the voltage differential depends upon a current differential between currents conducted by the specific reference cell connected to the specific reference bitline and by a selected memory cell connected to the specific common memory bitline.

5. The memory array of claim 1, further comprising:
   a memory wordline voltage generator that generates a memory wordline voltage;
   memory wordline decoders that apply the memory wordline voltage to memory wordlines, respectively;
   a reference wordline voltage generator that generates a reference wordline voltage; and
   a reference wordline decoder that applies the reference wordline voltage to the reference wordline,
   wherein levels of the memory wordline voltage and the reference wordline voltage are varied by the memory wordline voltage generator and the reference wordline voltage generator, respectively, depending upon operations being performed.

6. The memory array of claim 5,
   wherein, during a read operation to determine whether a selected memory cell is unprogrammed or programmed, the reference wordline voltage generator sets the reference wordline voltage at a first level sufficient to ensure that each reference cell conducts a reference current amount that is approximately midway between a first current amount expected to be conducted by an unprogrammed memory cell and a second current amount, which is less than the first current amount, and expected to be conducted by a programmed memory cell, and wherein, during a write operation to program the selected memory cell, the reference wordline voltage generator sets the reference wordline voltage at a second level that is different from the first level to facilitate margin testing.

7. The memory array of claim 1, wherein each of the memory cells and the reference cells comprise a single charge trap field effect transistor.

8. The memory array of claim 1, wherein each of the memory cells and the reference cells comprise multiple charge trap field effect transistors connected in parallel.

9. The memory array of claim 1, wherein all reference bitlines that connect the reference cells to the comparators are all electrically connected.

10. A memory array comprising:
memory cells, wherein each memory cell has a first terminal connected to a common memory wordline for a row of the memory cells, a second terminal connected to a common memory bitline for a column of the memory cells, and a third terminal connected to ground;
reference cells, wherein each reference cell has a first terminal connected to a common reference wordline, a second terminal connected to a reference bitline, and a third terminal connected to ground;
comparators, each comparator comprising a current mirror comprising:
a reference section comprising a reference cell input node and a current mirror node, wherein the reference cell input node is electrically connected by a specific reference bitline to a specific reference cell and wherein a current mirror node connector electrically connects all current mirror nodes of all of the comparators; and
a memory section comprising a memory cell input node and an output voltage node, wherein the memory cell input node is electrically connected to a specific common memory bitline for a specific column of the memory cells;
a memory wordline voltage generator that generates a memory wordline voltage;
memory wordline decoders that apply the memory wordline voltage to memory wordlines;
a reference wordline voltage generator that generates a reference wordline voltage; and
a reference wordline decoder that applies the reference wordline voltage to the reference wordline,
wherein levels of the memory wordline voltage and the reference wordline voltage are varied by the memory wordline voltage generator and the reference wordline voltage generator, respectively, depending upon whether read, write or erase operations are being performed.

11. The memory array of claim 10,
wherein the reference section comprises two first P-type field effect transistors and a first N-type field effect transistor electrically connected in series between a supply voltage and a pull-down node,
wherein the reference cell input node is at a junction between the two first P-type field effect transistors and the current mirror node is at a junction between one of the two first P-type field effect transistors and the first N-type field effect transistor,
wherein the memory section comprises two second P-type field effect transistors and a second N-type field effect transistor electrically connected in series between the supply voltage and the pull-down node,
wherein the memory cell input node is at a junction between the two second P-type field effect transistors and the output voltage node is at a junction between one of the two second P-type field effect transistors and the second N-type field effect transistor,
wherein gates of the two first P-type field effect transistors and the two second P-type field effect transistors are controlled by a current mirror voltage at the current mirror node, and
wherein gates of the first N-type field effect transistor and the second N-type field effect transistor are controlled by a bias voltage, and
wherein an additional N-type field effect transistor electrically connects the pull-down node to ground.

12. The memory array of claim 10, wherein each comparator further comprises a secondary comparator circuit that compares an output voltage at the output voltage node and a current mirror voltage at the current mirror node and that outputs a digital signal at a digital output node, wherein a value of the digital signal varies depending upon a voltage differential between the current mirror voltage and the output voltage and wherein the voltage differential depends upon a current differential between currents conducted by the specific reference cell connected to the specific reference bitline and by a selected memory cell connected to the specific common memory bitline.

13. The memory array of claim 10, wherein each comparator further comprises a secondary comparator circuit comprising:
a differential amplifier that receives, as inputs, a current mirror voltage from the current mirror node and an output voltage from the output voltage node; and
an inverter connected in series to the differential amplifier and that outputs a digital signal at a digital output node, wherein a value of the digital signal varies depending upon a voltage differential between the current mirror voltage and the output voltage and wherein the voltage differential depends upon a current differential between currents conducted by the specific reference cell connected to the specific reference bitline and by a selected memory cell connected to the specific common memory bitline.

14. The memory array of claim 10, wherein each of the memory cells and the reference cells comprise a single charge trap field effect transistor.

15. The memory array of claim 10, wherein each of the memory cells and the reference cells comprise multiple charge trap field effect transistors connected in parallel.

16. The memory array of claim 10, wherein, during a read operation to determine whether a selected memory cell is unprogrammed or programmed, the reference wordline voltage generator sets the reference wordline voltage at a first level sufficient to ensure that each reference cell conducts a reference current amount that is approximately midway between a first current amount expected to be conducted by an unprogrammed memory cell and a second current amount, which is less than the first current amount, and expected to be conducted by a programmed memory cell.

17. The memory array of claim 16, wherein, during a write operation to program the selected memory cell, the reference wordline voltage generator sets the reference wordline voltage at a second level that is different from the first level to facilitate margin testing.

18. The memory array of claim 16, wherein, during a write operation to program the selected memory cell, the reference wordline voltage generator sets the reference wordline voltage at a second level that is lower than the first level so that the reference current amount conducted by each reference cell during the write operation is closer to the second current amount.

19. The memory array of claim 10, wherein all reference bitlines that connect the reference cells to the comparators are all electrically connected.

20. A memory array comprising:
  memory cells, wherein each of the memory cells comprises at least one charge trap field effect transistor and wherein each memory cell has a first terminal connected to a common memory wordline for a row of the memory cells, a second terminal connected to a common memory bitline for a column of the memory cells and a third terminal connected to ground;
  reference cells, wherein the reference cells are essentially identical to the memory cells and wherein each reference cell has a first terminal connected to a common reference wordline, a second terminal connected to a reference bitline, and a third terminal connected to ground;
  comparators, each comparator comprising a current mirror comprising:
    a reference section comprising a reference cell input node and a current mirror node, wherein the reference cell input node is electrically connected by a specific reference bitline to a specific reference cell and wherein a current mirror node connector electrically connects all current mirror nodes of all of the comparators; and
    a memory section comprising a memory cell input node and an output voltage node, wherein the memory cell input node is electrically connected to a specific common memory bitline for a specific column of the memory cells;
  a memory wordline voltage generator that generates a memory wordline voltage;
  memory wordline decoders that apply the memory wordline voltage to memory wordlines;
  a reference wordline voltage generator that generates a reference wordline voltage; and
  a reference wordline decoder that applies the reference wordline voltage to the reference wordline,
  wherein levels of the memory wordline voltage and the reference wordline voltage are varied by the memory wordline voltage generator and the reference wordline voltage generator, respectively, depending upon whether read, write or erase operations are being performed,
  wherein, during a read operation to determine whether a selected memory cell is unprogrammed or programmed, the reference wordline voltage generator sets the reference wordline voltage at a first level sufficient to ensure that each reference cell conducts a reference current that is approximately midway between a first current amount expected to be conducted by an unprogrammed memory cell and a second current amount, which is less than the first current amount, and expected to be conducted by a programmed memory cell, and
  wherein, during a write operation to program the selected memory cell, the reference wordline voltage generator sets the reference wordline voltage at a second level that is lower than the first level to facilitate margin testing.

* * * * *